(12) United States Patent
Okada et al.

(10) Patent No.: US 7,300,500 B2
(45) Date of Patent: Nov. 27, 2007

(54) ADSORBENT-FORMED OBJECT AND AN ADSORBENT UNIT

(75) Inventors: Yuichi Okada, Okayama (JP); Yuko Hirano, Okayama (JP); Shingo Kubo, Okayama (JP)

(73) Assignee: Japan Gore-Tex, Inc. (JP)

( * ) Notice: Subject to any disclaimer, the term of this patent is extended or adjusted under 35 U.S.C. 154(b) by 134 days.

(21) Appl. No.: 10/962,214

(22) Filed: Oct. 7, 2004

(65) Prior Publication Data

US 2005/0241483 A1 Nov. 3, 2005

(51) Int. Cl.
B01D 53/02 (2006.01)
B01D 53/28 (2006.01)
G11B 33/14 (2006.01)

(52) U.S. Cl. ............ 96/153; 55/385.6; 360/97.02; 206/204; 252/194; 428/403

(58) Field of Classification Search ........ 206/0.7, 206/204; 95/117; 96/108, 134, 135, 147, 96/153; 55/385.6; 360/97.02; 252/194; 428/357, 403, 407

See application file for complete search history.

(56) References Cited

U.S. PATENT DOCUMENTS

| | | | | |
|---|---|---|---|---|
| 5,393,457 A | * | 2/1995 | Miksic et al. | 252/194 |
| 5,851,672 A | * | 12/1998 | Wang et al. | 428/407 |
| 6,214,095 B1 | * | 4/2001 | Logan et al. | 96/147 |
| 6,887,302 B2 | * | 5/2005 | Rajagopalan et al. | 95/116 |
| 2003/0037677 A1 | * | 2/2003 | Boroson et al. | 96/108 |
| 2005/0227114 A1 | * | 10/2005 | Tanaka et al. | 428/690 |
| 2006/0060086 A1 | * | 3/2006 | Wang et al. | 96/108 |

FOREIGN PATENT DOCUMENTS

| | | | |
|---|---|---|---|
| JP | 63-105495 A | * | 5/1988 |
| JP | 3-109916 | | 5/1991 |
| JP | 7-68125 | | 3/1995 |
| JP | 2001-198429 | | 7/2001 |
| JP | 2001-277395 | | 10/2001 |

* cited by examiner

Primary Examiner—Frank M. Lawrence
(74) Attorney, Agent, or Firm—Carol A. Lewis White

(57) ABSTRACT

An adsorbent molded article comprising granular absorbant and binder having sustained adsorption over an indefinite period; an adsorbent unit employing said adsorbent molded article; and a housing employing said adsorbent molded article or adsorbent unit.

40 Claims, 8 Drawing Sheets

ADSORBENT-FORMED OBJECT AND AN ADSORBENT UNIT

BACKGROUND OF THE INVENTION

1. Field of the Invention

The present invention relates to an adsorbent molded article intended primarily for use in electronic or optical equipment housings; to an adsorbent unit employing said molded article; and to a housing employed by said adsorbent molded article or adsorbent unit.

2. Description of Related Art

It is known that in electronic or optical equipment, such as hard disk drive units, equipment service life is significantly affected by the presence of moisture or other gases within the unit.

For example, in organic electroluminescent (EL) displays, which have drawn considerable attention in recent years as the "next generation" of displays, the light emission characteristics of the organic EL elements (i.e. luminance, uniformity of light emission, etc.) clearly degrade over time due to the effects of even trace amounts of moisture.

Adsorbents for placement in the housing of housing-enclosed piece of optical or electronic equipment, such as an organic EL element, for the purpose of adsorbing moisture or other gases having adverse effects on the equipment, must be able to sustain moisture absorbing ability over an indefinite period.

Where the housing of a piece of optical or electronic equipment is a semi-hermetic enclosure, it is common practice to seal the cover and enclosure body together with a sealing resin (bonding adhesive) or by means of screws with a gasket interposed; eventually, moisture outside the housing will gradually infiltrate through the sealing resin or gasket portion, causing the optical or other equipment to degrade over time. Accordingly, the bonding adhesive must adsorb and remove not only moisture trapped in the housing during fabrication of the optical equipment, but also moisture gradually infiltrating during service.

Degradation of organic EL elements over time is known to occur through the following mechanism. Moisture adsorbed onto surfaces of components of organic EL elements or penetrating into organic EL elements eventually penetrates into structures composed of a pair of electrodes and a luminescent material sandwiched between the electrodes (hereinbelow sometimes referred to as "organic EL structures"), penetrating into gaps or other flaws on the cathode surface, resulting in delamination of the luminescent material and cathode. Since current flow is hindered through the delaminated area, the area appears as a defective pixel ("dark spot").

To avoid the problem of deterioration in organic EL elements over time, there have been proposed a number of methods for housing organic EL elements within a hermetic enclosure, and additionally arranging an adsorbent within the enclosure, in order to adsorb out moisture in the enclosure as well as any other gases that could degrade the organic EL elements.

Kokai 3-261091, for example, teaches an organic EL element wherein the organic EL structures are housed within an airtight case, with desiccant means containing diphosphorus pentaoxide arranged therein, isolated from the organic EL structures. However, as this technique entails deliquescence of the diphosphorus pentaoxide through adsorption of moisture within the airtight case, it is difficult to keep the desiccant means isolated from the organic EL structures within the case. In the event that the deliquesced diphosphorus pentaoxide should leak from the airtight case, the organic EL structures could become contaminated and possible malfunction. It is therefore necessary to contain deliquesced diphosphorus pentaoxide within the case in such a way that it does not leak, and the higher production cost entailed in achieving this may make such devices impractical.

Kokai 9-148066 teaches an organic EL element that, instead of desiccant means containing diphosphorus pentaoxide, employs desiccant means comprising a compound that chemical adsorbs water, as well as remaining solid as it adsorbs moisture (i.e., a so-called chemical adsorbent).

Kokai 2001-278999 teaches a gaseous component treatment sheet material composed of gas-permeable matrix film having dispersed therein a remover of particulate form that removes specific gaseous components, and an EL element comprising said sheet material. Moisture is also targeted as a component for removal, and several kinds of desiccants can be cited as examples of the remover. Kokai 2002-43055 teaches an organic EL element that, instead of desiccant means of Kokai 3-261091, employs a hygroscopic molded article composed of hygroscopic material and a resin component. These techniques employ particulate hygroscopic material in the form of a molded article (sheet), which offers the advantages of ease of handling during organic EL element fabrication, and low cost.

However, the adsorbents (hygroscopic materials) used in the techniques taught in Kokai 9-148066, Kokai 2001-278999 and Kokai 2002-43055 experience a sharp drop in the rate of moisture adsorption subsequent to fabrication of the organic EL element, after adsorbing moisture at a relatively early stage, as a result of which moisture that gradually penetrates into the airtight case from the outside cannot be adsorbed over an extended period of time, so that ultimately the light emission characteristics of the organic EL element degrade.

The adverse effects of moisture gradually penetrating in from the outside are not limited to organic EL elements, but is a problem common to many types of electronic and optical equipment employing semi-hermetic enclosures as housings.

With the foregoing in view, it is an object of the present invention to provide an adsorbent molded article having sustained adsorption over an indefinite period; an adsorbent unit employing said adsorbent molded article; and a housing employing said adsorbent molded article or adsorbent unit.

This and other purposes of the present invention will become evident from review of the following specification.

SUMMARY OF THE INVENTION

The adsorbent molded article of the present invention, whereby the stated object is achieved, comprises as constituent materials thereof granular adsorbent and binder resin; wherein an adsorbent molded article having volume of about 98 mm$^3$, when placed in a cell of about 14.3 cm$^3$ capacity having an air intake and an air outlet, supplied via said air intake with a continuous about 50 cm$^3$/min of hydrated gas having a dew point of about −15° C., and measured for the percentage of moisture removed from hydrated gas exiting via said air outlet (hereinbelow, simply "percentage of moisture removed") takes about 10 hours or more for said percentage of moisture removed to reach about 30% or less.

Alternatively the adsorbent molded article herein is intended for use within a housing, and comprises as constituent materials thereof granular adsorbent coated partially or completely with an absorption-regulating substance and binder resin.

As used herein, "granular adsorbent coated partially with an absorption-regulating substance" refers both to the case where some of the granular adsorbent are not coated with the absorption-regulating substance, and to the case where surfaces of some or all of the granular adsorbent are partially coated with the absorption-regulating substance.

In preferred practice the adsorbent molded article herein is porous.

Exemplary granular adsorbent include moisture adsorbent materials, with alkaline earth metal oxides being especially preferred. The absorption-regulating substance is advantageously a fatty acid and/or derivative thereof.

The binder resin is advantageously a fluororesin and/or polyolefin resin, with polytetrafluoroethylene (PTFE) being especially preferred.

In preferred practice the adsorbent molded article will have a spectral reflectance factor of about $\leq 0.7$, as measured by JIS Z 8722 Method b.

The adsorbent unit herein is used within a housing, and features the use of the adsorbent molded article herein. In exemplary preferred embodiments of the adsorbent unit, the adsorbent molded article is provided at least in part with a pressure sensitive adhesive portion or bonding adhesive portion; or the adsorbent molded article is contained within a containing structure composed at least in part of breathable sheet material. The breathable sheet material is preferably porous polytetrafluoroethylene film. The containing structure may be unified with the housing.

The invention encompasses also a housing having in the interior thereof the adsorbent molded article herein of the adsorbent unit herein; an organic EL element employing the housing herein; and a hard disk drive unit employing the housing herein. The housing may constitute a semi-hermetic enclosure. As used herein, "semi-hermetic enclosure" includes hermetic enclosures whose interior is completely isolated from the outside, and enclosures having one or more air intake openings communicating between the enclosure interior and the outside, for the purpose of regulating internal pressure, for example.

A granular adsorbent for use in an adsorbent molded article, wherein the granular adsorbent surfaces are coated in part or totally with an absorption-regulating substance, also fall within the scope of the invention.

DESCRIPTION OF THE DRAWINGS

The operation of the present invention should become apparent from the following description when considered in conjunction with the accompanying drawings, in which.

DETAILED DESCRIPTION OF THE INVENTION

The inventors perfected the present invention based on the discovery that an adsorbent molded article of specific composition provides sustained moisture absorbing ability for an indefinite period.

The adsorbent molded article herein comprises granular adsorbent and binder resin, and takes 10 hours or more, preferably 15 hours of more, for the percentage of moisture removed thereby to reach 30% or less.

Figure 23:
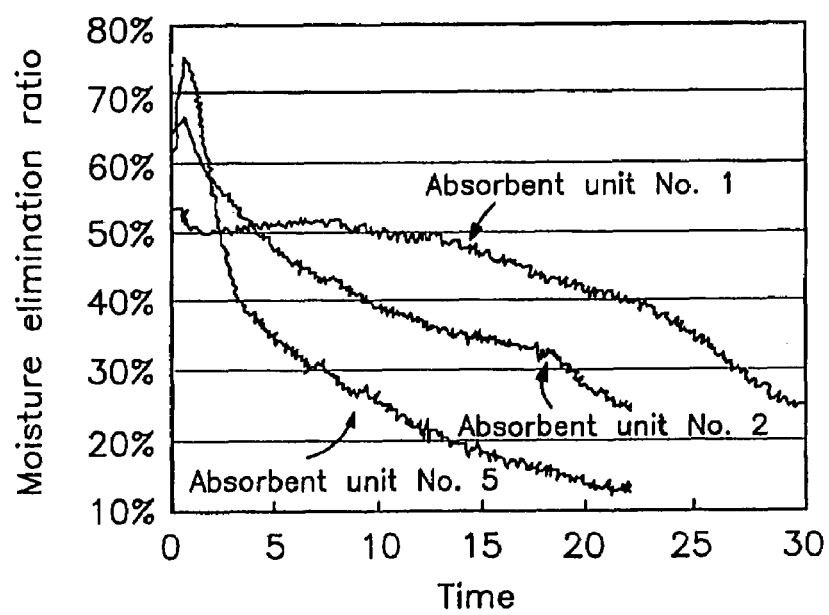
FIG. 23 is a graph showing change over time in percentage moisture removal by adsorbent units No. 1, 2 and 5.

Time required for the percentage of moisture removed to reach 30% or less is determined as follows. The adsorbent molded article is desiccated for 20 minutes at 150° C., placed under nitrogen gas, and cut to into a piece having volume of 98 mm$^3$. The cut adsorbent molded article is then placed in a cell of 14.3 cm$^3$ capacity having an air intake and an air outlet. A flow of hydrated gas having a dew point of −15° C. is then supplied at a rate of 50 cm$^3$/min into the cell via the air intake, and the dew point of the gas exiting the outlet is measured every hour, calculating adsorption every hour. Percentage of moisture removed every hour is calculated from this adsorption value and the moisture content of hydrated gas having a dew point of −15° C. (1.387 mg/L). Data for percentage of moisture removed at each measurement point is graphed as shown in FIG. 23, and the point in time at which percentage of moisture removed reaches <30% is determined.

Where the time required for percentage of moisture removed to reach <30% exceeds the lower limit taught herein, adsorbent life will not be of duration adequate for application thereof in an organic EL element (which is a preferred application of the invention), making it difficult to prevent deterioration of light emission characteristics to a satisfactory extent. Longer times for the percentage of moisture removed to reach <30% are preferred.

This and other features of the granular adsorbent herein are achieved through the use of granular adsorbent coated partially or completely with an absorption-regulating substance.

The reason that the adsorbent molded article herein comprised of granular adsorbent coated partially or completely with an absorption-regulating substance maintains moisture adsorbency over indefinite periods is not entirely clear, but the following general observations may be made.

Conventional adsorbents have rather high rates of adsorption, and, in the initial stage after assembly of a piece of optical or other equipment, rapidly adsorb a greater amount than necessary of moisture etc. present in the housing. This creates an extremely high partial pressure differential for moisture etc. present in the housing, which promotes infiltration of ambient moisture into the housing interior. As moisture etc. infiltrating the housing continues to be adsorbed, adsorbing ability drops sharply. This problem has been noted also with the gaseous component treatment sheet material taught in Kokai 2001-278999 and the hygroscopic molded article taught in Kokai 2002-43044. The reason is that the gaseous component treatment sheet material and hygroscopic molded article either employ as binder resin components resins that are highly gas permeable (highly gas permeable resin) or resins (such as PTFE) that do not provide complete coverage of adsorbent particle surfaces, or employ a molded article (sheet) that is porous overall, so that the rate of adsorption by the adsorbent contained therein is not regulated.

The adsorbent molded article herein, on the other hand, employs granular adsorbent coated with an absorption-regulating substance, and thus during the initial stage after assembly of a piece of optical or other equipment, the rate of adsorption is slower than with conventional adsorbents, so that the material does not rapidly adsorb moisture within the housing at a level in excess of that needed to prevent deterioration of optical or other equipment. Accordingly the partial pressure differential of moisture inside and outside the housing is lower than is the case where a conventional adsorbent is used, reducing infiltration of moisture into the housing from the outside. This is thought to be responsible for sustained adsorption over an indefinite period. A fuller understanding of the adsorbent molded article herein is provided through the following detailed description.

The granular adsorbent used for the adsorbent molded article herein are not particularly limited and may be selected from among adsorbents known in the art, with reference to the gas needing to be adsorbed out. Examples are moisture adsorbents (hygroscopic agents), oxygen adsorbents, other gas adsorbents, etc. Granular adsorbent morphology may be selected appropriately from known morphologies such as granular (including powdered), bead, flake and fibrous; granules provide superior processability when molding the adsorbent molded article. Granular adsorbent size is preferably at least 0.5 µm, and no more than one-half the thickness of the final adsorbent molded article subsequent to molding. Where granular adsorbent size is below this range, processability when molding the adsorbent molded article tends to be poor; size above this range makes it difficult to mold the adsorbent molded article.

The moisture adsorbents include chemical adsorbents that adsorb moisture chemically, and physical adsorbents that adsorb moisture physically. Chemical adsorbents include: $NaO_2$, $K_2O$ and other alkali metal oxides; CaO, MgO, SrO, BaO and other alkaline earth metal oxides; $CaCl_2$, $MgCl_2$, $CrCl_2$, $FeCl_2$, $NiCl_2$ and other metal halides; $CaSO_4$, $MgSO_4$, $FeSO_4$, $NiSO_4$ and other metal sulfates; $KClO_4$, $NaClO_4$, $Fe(ClO_4)_2$, $Co(ClO_4)_2$, $Ca(ClO_4)_2$, $Mg(ClO_4)_2$, $Ba(ClO_4)_2$, $Mn(ClO_4)_2$ and other perchlorates; and so on. Physical adsorbents include activated carbon, zeolite, alumina, silica, boria, titania, silica gel, sepiolite, activated clay and so on. Alkaline earth metal compounds are preferred for their high adsorbent capacity. Activated carbon, in addition to is action as a physical adsorbent, also depresses the reflectivity of the adsorbent molded article, and concomitant use thereof with other granular adsorbents is advantageous. By using activated carbon, reflectivity of the adsorbent molded article is reduced, so when used for an organic EL element, decline in organic EL element picture quality can be prevented, as described later.

Moisture adsorbents may be used singly or in combinations of two or more kinds, as may combinations of chemical adsorbents and physical adsorbents. When producing adsorbent molded articles from a combinations of chemical adsorbents and physical adsorbents for use in the organic EL element applications preferred herein, it is advantageous to use physical adsorbent in amounts of 0.1 to 30 weight parts, preferably 1 to 20 weight parts, per 100 weight parts of chemical adsorbent. Physical adsorbents reversibly adsorb and desorb moisture, and if present in large quantity in the mixture, the rate at which the physical adsorbent re-desorbs moisture it has previously adsorbed when the environment of the housing goes from low temperature to high temperature may overcome the rate of moisture adsorption by the adsorbent molded article, in some instances resulting in adverse effects on components within the housing.

Exemplary oxygen adsorbents include powdered metals and metal oxides, particularly powdered iron and powdered FeO. Oxygen adsorbents may be used singly or in combinations of two or more kinds, or in combination with moisture adsorbents mentioned above. Adsorbent molded articles prepared from mixtures with the above chemical adsorbents (moisture adsorbents) for use in organic EL element applications will advantageously contain oxygen adsorbent in amounts of 0.1 to 50 weight parts, preferably 1 to 30 weight parts, per 100 weight parts of chemical adsorbent. As the amount of granular adsorbent that can be incorporated into the binder resin of an adsorbent molded article is limited, oxygen adsorbent content exceeding the range taught above results in correspondingly small chemical adsorbent content in the adsorbent molded article, so that hygroscopic performance tends to decline. On the other hand, oxygen adsorbent content below the range taught above may result in an inability to ensure the effect obtained by adding the oxygen adsorbent (i.e. adsorption of oxygen).

Gas adsorbents for adsorbing gases other than moisture and oxygen (hereinafter simply "gas adsorbents") include, for example, activated carbon and zeolite. Activated carbon and zeolite may be subjected to specific pretreatments to make them selectively adsorb specific gases. For example, a salination pretreatment can be used to enable the material to selectively adsorb out acidic gases. Application of adsorbent molded articles containing such gas adsorbents in organic EL elements makes it possible to effective adsorb out organic gases evolves during curing of epoxy resins used as sealing resins.

Activated carbon is a preferred gas adsorbent due to its extremely high adsorption capacity. Where activated carbon is used, surface area is advantageously 200-2500 $m^2/g$, preferably 500-2000 $m^2/g$. Activated carbon surface area below this range may in some instances result in inability to ensure adequate adsorbing performance, whereas activated carbon surface area above this range tends to reduce packing density in the adsorbent molded article, and diminished adsorbing performance.

The above gas adsorbents may be used singly or in combinations of two or more kinds, as may combinations thereof with the moisture adsorbents and/or oxygen adsorbents mentioned above. For example, adsorbent molded articles prepared from mixtures with the above chemical adsorbents (moisture adsorbents) for use in organic EL element applications will advantageously contain gas adsorbent in amounts of 0.1 to 30 weight parts, preferably 0.5 to 20 weight parts, per 100 weight parts of chemical adsorbent. As the amount of granular adsorbent that can be incorporated into the binder resin of an adsorbent molded article is limited, gas adsorbent content exceeding the range taught above results in correspondingly small chemical adsorbent content in the adsorbent molded article, so that hygroscopic performance tends to decline. On the other hand, gas adsorbent content below the range taught above may result in inability to ensure the effect obtained by adding the gas adsorbent.

Binder resins for adsorbent molded articles may be selected from among thermoplastic resins known in the art, with fluororesins or polyolefin resins being advantageous.

Exemplary fluororesins include PTFE, copolymers of tetrafluoroethylene and ethylenically unsaturated monomers (e.g. tetrafluoroethylene/hexafluoropropylene copolymer, ethylene/tetrafluoroethylene copolymer, tetrafluoroethylene/perfluoroalkyl vinyl ether copolymer etc.), polychlorotrifluoroethylene, polyvinylidene fluoride, polyvinyl fluoride etc. Exemplary polyolefin resins are polyethylene, polypropylene etc.

Of the exemplary binder resins cited above, PTFE is preferred for the following reasons. Adsorbing ability of the granular adsorbent herein must not be impaired by the binder resin, and since PTFE does not completely cover granular adsorbent surfaces, the adsorbent molded article is porous, so as to ensure adequate adsorbing ability. PTFE is also highly resistant to heat and chemicals.

The absorption-regulating substance used to coat the granular adsorbent herein is not limited provided that it does not significantly affect adsorbent capacity of the granular adsorbent, allows moisture or other gas to permeate while slowing the rate of adsorption, and adheres well to granular adsorbent surfaces.

Representative absorption-regulating substances include oils and fats, hydrocarbons, and fatty acids.

Oils and fats include natural oils and fats such as soybean oil, coconut oil, linseed oil, cottonseed oil, rapeseed oil, tung oil, pine oil, rosin, castor oil, tallow, squalane, lanolin and other natural oils and fats or animal or vegetable origin; refined forms thereof; and hydrogenated oils thereof. Hydrocarbons include the $C_{20-48}$ aliphatic hydrocarbons known as paraffin waxes, and their derivatives; $C_{8-19}$ aliphatic hydrocarbons and their derivatives; paraffin-, naphthene- or aromatic-base process oils; liquid paraffin; hydrocarbons refined from the above natural oils and fats, and so on. Fatty acids lauric acid, myristic acid, palmitic acid, stearic acid, oleic acid, behenic acid and other fatty acids; salts of these fatty acids; and derivatives (e.g. esters) of these fatty acids.

Additionally, compounds generally known as silane coupling agents, aluminum coupling agents, and titanate coupling agents may be used as absorption-regulating substances. Exemplary silane coupling agents include methyl trimethoxy silane, γ-aminopropyl triethoxy silane, N-(β-aminoethyl)-γ-aminopropyl trimethoxy silane, N-phenyl aminomethyl trimethoxy silane, vinyl methyl diethoxy silane etc. Aluminum coupling agents include aluminum isopropylate, aluminum ethylate, aluminum tris(ethyl acetoacetate), ethyl acetoacetate aluminum diisopropylate etc. Titanate coupling agents include isopropyl triisostearoyl titanate, isopropyl tris(dioctyl pyrophosphate)titanate, tetraoctyl bis(ditridecyl phosphite)titanate, bis(dioctyl pyrophosphate) oxyacetate titanate etc.

The absorption-regulating substances listed above may be used singly or in combinations of two or more kinds. Of the above absorption-regulating substances, fatty acids that are liquid at normal temperature are especially advantageous. Since these are liquid, it is possible to produce a thin, uniform coating on the granular adsorbent. Since the above fatty acids are useful also as processing aids, use thereof is advantageous in terms of improving moldability of adsorbent molded articles as well.

The method for coating granular adsorbents with absorption-regulating substances is not critical, and may be selected appropriately for the absorption-regulating substance being used. Exemplary methods are mixing with a high speed mixer, super mixer, Henschel mixer, universal mixer, Nauta mixer or other screw mixer; RIBOKON™ ribbon mixer or other ribbon mixer; plough share mixer; die blender or the like. Absorption-regulating substances that are solid at normal temperature may be either warmed to a temperature above the melting point of the absorption-regulating substance, or dissolved/dispersed in water or known organic solvent (e.g. benzene, toluene, hexane etc.) and coated in liquid form using one of the mixing processes mentioned above.

Recommended absorption-regulating substance coating weight, based on 100 weight parts of granular adsorbent, is at least 0.01 weight parts, preferably at least 0.05 weight parts; and no more than 20 weight parts, preferably no more than 10 weight parts, and more preferably no more than 5 weight parts. If the amount of absorption-regulating substance is below the range taught herein the rate of adsorption by the granular adsorbent may not be depressed by a sufficient extent, so that adsorbing ability of the adsorbent molded article is not readily sustained for an extended period. If the amount of absorption-regulating substance exceeds the above range, adsorption may be depressed excessively so that adsorbing ability of the adsorbent molded article tends to suffer.

Provided that the adsorbing ability of the adsorbent molded article herein is sustained for an extended period, some or all of granular adsorbent contained therein may be coated with an absorption-regulating substance, the proportion of granular adsorbent coated with the absorption-regulating substance being selected appropriately with reference to the required adsorbing ability (i.e. adsorbent capacity, rate of adsorption etc.). For a granular adsorbent coated with an absorption-regulating substance, provided that the adsorbing ability of the adsorbent molded article herein is sustained for an extended period, granule surfaces may be partially or completely coated by the absorption-regulating substance, with the proportion of granular adsorbent surface coated by the absorption-regulating substance being selected appropriately with reference to the required adsorbing ability (i.e. adsorbent capacity, rate of adsorption etc.).

The following exemplary description of a method for making a adsorbent molded article herein takes the example of using PTFE as the binder resin. The granular adsorbent surfaces are partially or completely coated with the absorption-regulating substance, and blended with PTFE power or granules, and, optionally, granular adsorbent not coated with absorption-regulating substance. This mixture is kneaded with a molding aid, shaped into a preform, molded by ram extrusion, and then dried to eliminate the molding aid, to give an adsorbent molded article. Adsorbent molded article shape is not critical, and depending on requirements may be a sheet or rod profile (e.g. a round rod profile, or square or other polygonal profile); rod profiles may be cut into blocks of suitable length. Sheet profiles may punched out to give adsorbent molded articles of circular shape, square or other polygonal shape, star shape etc. Size is not critical, being determined with reference to required adsorbing ability, available space for the adsorbent molded article etc. Adsorbent molded article shape and size can be controlled by manipulating the shape and size of the die in ram extrusion. Methods for producing sheet profiles from mixtures of granular adsorbent and binder resin are not limited to that described above, it being possible to employ any of the methods known in the art, provided that the sheet profile produced thereby has the required adsorbing ability.

Recommended mixture proportions for the binder resin and granular adsorbent (including materials coated and uncoated with absorption-regulating substance) are at least 10 wt %, preferably at least 20 wt %, and no more than 98 wt %, preferably no more than 96%, of granular adsorbent based on the total weight (100%) of the binder resin and granular adsorbent. Where the proportion of granular adsorbent falls below this range there is a tendency to not be able to ensure adequate absorbing ability. Where the proportion of granular adsorbent is above this range, on the other hand, molding of the adsorbent molded article tends to be difficult.

Cyclic dimethyl polysiloxane, ethanol, hexane or the like may be used as the molding aid mentioned above. Molding aids are typically added in amount of 10 to 100 parts by weight, based on 100 parts by weight of total binder resin and granular adsorbent.

Typical conditions for producing the aforementioned perform are pressure: 0.1-0.4 MPa; pressing time: 60-300 sec.; temperature: 15-50° C. Typical conditions for the aforementioned ram extrusion are extrusion pressure: 5-20 MPa; extrusion speed: 10-30 mm/min.; temperature: 30-70° C. Typical post-molding drying conditions are temperature: 200-250° C.; time: 1-24 hr.

As noted, where PTFE is employed as binder resin, granular adsorbent surfaces are not completely covered by the PTFE, as a result of which the adsorbent molded article has a porous structure, thereby ensuring better adsorbing ability.

Adsorbent molded articles herein may also be produced from compositions obtained by blending granular adsorbents with photocuring resins (e.g. vinyl ester resins known in the art), photopolymerization initiators (e.g. benzophenone and other compounds known in the art), and/or gas permeable binder resins, the blend being placed in a mold or containing structure used as the adsorbent unit, described hereinbelow, and irradiated with ultraviolet. Gas permeable binders serve as passages through which a gas targeted for adsorption by a adsorbent molded article can permeate and come into contact with the granular adsorbent. For example, a moisture permeable resin (e.g. cellulose acetate, epoxy resin, phenoxy resin, polysiloxane, methacrylate resin, sulfone resin, phthalate resin or polyamide resin) would be used as a gas permeable binder for a adsorbent molded article required to adsorb moisture.

The methods of making adsorbent molded articles described hereinabove are merely illustrative, and imply no limitation of the invention.

As the invention contemplates application of the adsorbent molded article herein in an organic EL element, reflection of light from the surfaces of the article is preferably minimal, a specific recommendation being a spectral reflectance factor of $\leq 0.7$, in accordance with JIS Z 8722 Method b. If the spectral reflectance factor of an adsorbent molded article exceeds the above range, external light (e.g. sunlight) infiltrating between the light emitting portions (dots) of the organic EL element will be reflected by the adsorbent molded article. Since the reflected light is visible to the naked eye, the organic EL element may experience degraded picture quality. Since it is therefore desirable to keep reflection of external light to a level below that detectable by the naked eye, an adsorbent molded article spectral reflectance factor of no more than 0.7 is recommended. No more than 0.5 is preferred.

The spectral reflectance factor of adsorbent molded articles may be kept to below the upper limit taught herein by means of a method such as incorporating activated carbon. Where activated carbon is used, preferred practice is to use activated carbon of 5-50 μm mean particle size, in amounts of 2-25 weight parts per 100 weight parts of total binder resin/granular adsorbent.

For application in a housing, the adsorbent molded article may be applied as the adsorbent unit herein, described hereinbelow, or, for example, for application in a housing fabricated of magnetic material, adding iron powder to the adsorbent molded article, the resultant magnetism being used to secure the article to the housing.

The adsorbent unit of the invention is now described.

Adsorbent Unit

The adsorbent unit herein employs the adsorbent molded article herein, applied within a housing. The adsorbent unit is not limited as to shape; for application, for example, in a housing in which the unit must be affixed, the shape will preferably be one allowing it to be readily affixed.

Figure 1:
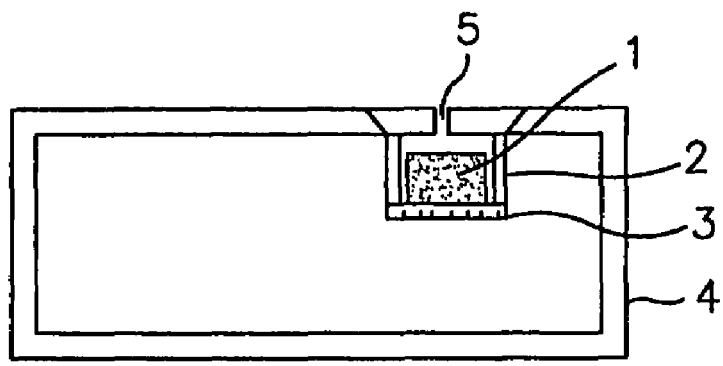
FIG. 1 is a sectional view showing an exemplary adsorbent unit of the invention enclosed within a containing structure.

In one exemplary adsorbent unit, hygroscopic material is contained in a receptacle, pouch or other containing structure having a vent portion in at least a portion thereof (FIG. 1). Containing structure shape is not limited provided that the shape conforms to the housing in which it will be applied. Nor is the material of the containing structure material particularly limited: by way of example, where the aim is ease of attachment within the housing, it is advantageous to provide breathable sheet material over a portion of a resin or metal receptacle to form a vent portion therefor.

Breathable sheet materials are not particularly limited provided that the material blocks passage of granular adsorbent that could be shed from the adsorbent molded article, while allowing passage of moisture or other gas. Exemplary materials include woven or nonwoven fabrics of polyester fiber, polyamide fiber, polyolefin fiber, fluororesin fiber or other such organic fibers, or of glass fiber or other inorganic fibers; paper or synthetic paper; porous resin film of materials such as fluororesin, polyolefin resin, polyester resin or polyurethane resin; nonporous, moisture permeable resin films of polyurethane resin, silicone resin etc.; foam materials of polyurethane resin, melamine resin, polyolefin resin etc.; laminates which are combinations of the above materials; and so on. Porous resin film is preferred for ease of thinning, low dusting, and good gas (e.g. moisture) permeability, with PTFE being especially preferred for its dust free properties, and excellent resistance to heat and chemicals.

Where a porous resin film is applied as breathable sheet material, the porous resin film will have maximum pore size of 0.01-10 μm, preferably 0.1-1 μm. Maximum pore size below this range makes the film difficult to produce, while conversely film above this range may permit passage of granular adsorbent that shed from the adsorbent molded article. Porous resin film porosity is preferably 30-98%, more preferably 60-95%. Film with porosity below this range have low permeability to moisture and other gases, which tends to impair the absorbing ability of the adsorbent molded article. On the other hand, porosity above this range results in low film strength and difficulty in handling during fabrication. Porous resin film maximum pore size is measured in accordance with ASTM F-316. Porous resin film porosity is measured on the basis of apparent density in accordance with JIS K 6885, from apparent density $\rho$ (g/cm$^3$) and PFTE density (2.2 g/cm$^3$), using the following equation.

porosity (%)=100×(2.2−$\rho$)/2.2

Porous resin film thickness preferably ranges from 5 to 300 μm, more preferably 10 to 150 μm. Film of thickness below this range has low strength and tends to be difficult to handle. On the other hand, film of thickness below this range is more costly, less permeable to moisture and other gases, and tends to impair the absorbing ability of the adsorbent molded article. Porous resin film thickness herein is average thickness (measured in the unloaded state, apart from the load imposed by the chassis spring) as measured with a dial gauge (e.g. a $\frac{1}{1000}$ mm dial thickness gauge from Technolock).

Figure 2:
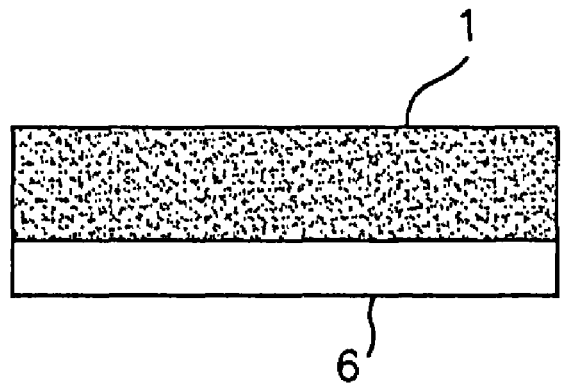
FIG. 2 is a sectional view showing an exemplary adsorbent unit of the invention.
Figure 3:
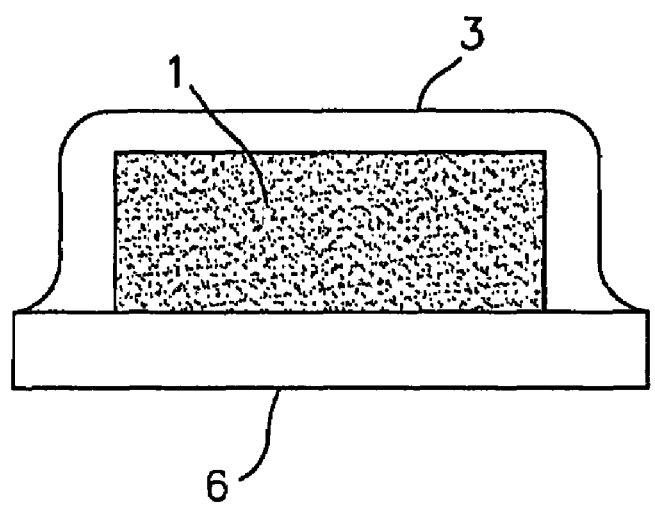
FIG. 3 is a sectional view showing an exemplary adsorbent unit of the invention.
Figure 4:
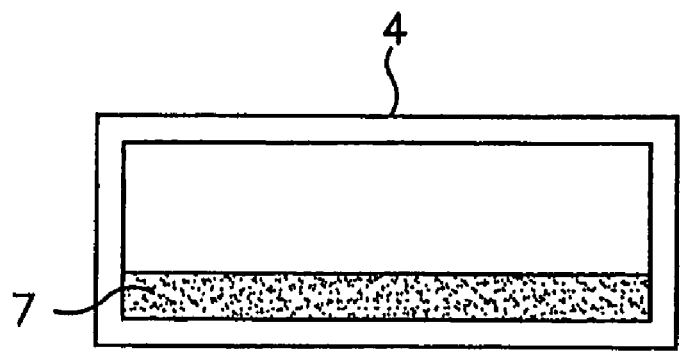
FIG. 4 is a sectional view showing exemplary application of an adsorbent unit of the invention.
Figure 5:
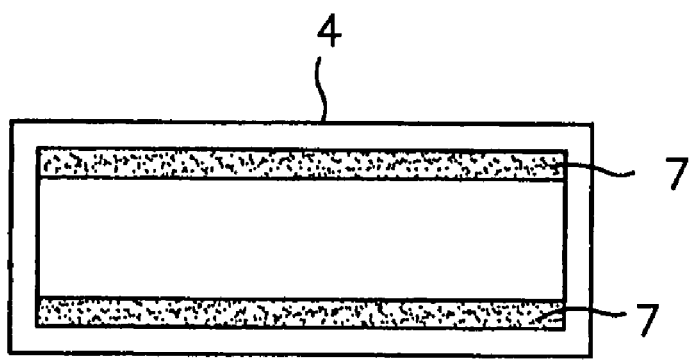
FIG. 5 is a sectional view showing exemplary application of an adsorbent unit of the invention.
Figure 6:
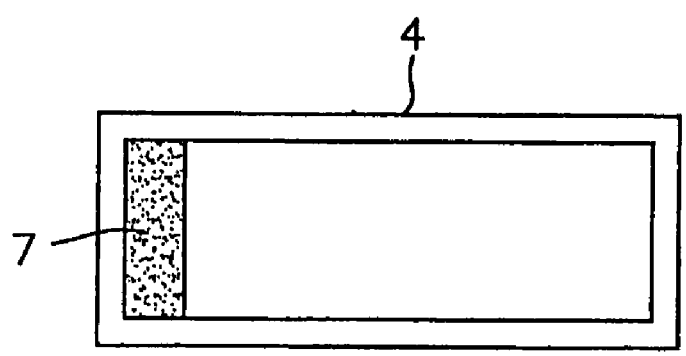
FIG. 6 is a sectional view showing exemplary application of an adsorbent unit of the invention.
Figure 7:
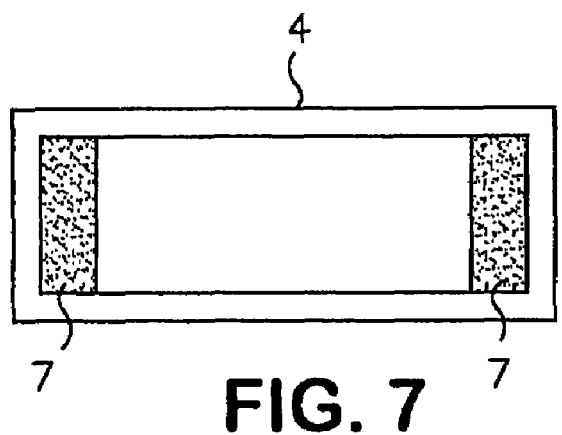
FIG. 7 is a sectional view showing exemplary application of an adsorbent unit of the invention.

The adsorbent molded article may be provided in at least a portion thereof with a pressure sensitive adhesive portion or bonding adhesive portion produced with a pressure sensitive adhesive or bonding adhesive (hereinafter "pressure sensitive/bonding adhesive"), allowing the adsorbent unit to be affixed to the inside of the housing. An exemplary adsorbent unit of this design is illustrated in FIG. 2. Yet other preferred arrangements for adsorbent units are one wherein pressure sensitive/bonding adhesive, such as a pressure sensitive adhesive sheet, is applied over a portion of the adsorbent molded article, and breathable material is laminated to some or all surfaces not covered by the pressure sensitive/bonding adhesive; and one wherein pressure sensitive/bonding adhesive, such as a pressure sensitive adhesive sheet, is applied over a portion of the adsorbent molded article, and all surfaces not covered by the pressure sensitive/bonding adhesive are covered with breathable material. With these arrangements, granular adsorbent shed from the adsorbent molded article can be prevented from scattering about. Breathable materials may consist of the same breathable sheet materials given earlier as examples for container structure. An exemplary adsorbent unit having an arrangement in which all surfaces other than that covered by pressure sensitive/bonding adhesive are covered by breathable material (breathable sheeting) is shown in FIG. 3. Breathable sheet 3 is affixed about the peripheral edges of adsorbent molded article 1 by means of pressure sensitive/bonding adhesive (pressure sensitive adhesive 6).

Where the adsorbent unit is composed of breathable sheeting laminated to an adsorbent molded article, the breathable sheeting may be attached to one face of the adsorbent molded article by means of adhesion or thermal bonding, for example. For adhesive lamination, areas of adhesive may be transferred by means of a gravure roll etc. to the lamination face of the adsorbent molded article or breathable sheeting, and adhered together. Transferred adhesive coverage is typically 3-95%, preferably 10-80%. Adhesive coverage below this range may not give adequate strength, while above this range the adsorbing ability of the adsorbent molded article may suffer.

Where lamination is accomplished through thermal bonding, the juxtaposed adsorbent molded article and breathable sheet are passed through heat rolls to subject them to heat and pressure, causing the adsorbent molded article binder resin and/or the lamination face of the breathable sheet to partially melt and fuse together. Thermal bonding may also be accomplished by the above method, but interposing between the adsorbent molded article and breathable sheet a sheet (or net) of a hot melt adhesive known in the art. The area of thermal bonding is 3-95%, preferably 10-80%.

Pressure sensitive/bonding adhesives for use in adsorbent units may be selected appropriately from acrylic base, rubber base and other materials known in the art; acrylic adhesives are preferred for their outstanding heat resistance. In preferred practice the adhesive will withstand temperatures in excess of 80° C., preferably 120° C. Where heat resistance is below the temperature taught herein, delamination resulting from thermal lad during service may occur, depending on the application. Pressure sensitive/bonding adhesive thickness is not critical, but typically is 25-500 μm, preferably 45-200 μm. Thickness within this range assures adequate adhesion (cohesiveness) and avoids scaling-up (increased thickness) of the housing. For pressure sensitive adhesive, it is possible to use pressure sensitive adhesive sheet (also known as "double sided pressure sensitive adhesive tape") composed of three layers: a base of polyester, polyamide or the like, having pressure sensitive adhesive laminated to either side.

Figure 8:
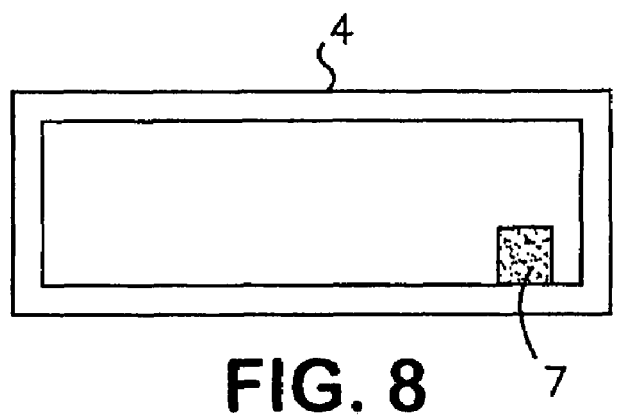
FIG. 8 is a sectional view showing exemplary application of an adsorbent unit of the invention.
Figure 9:
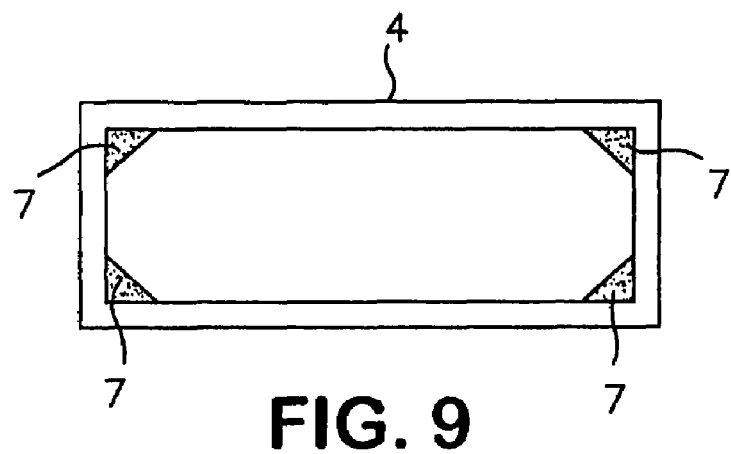
FIG. 9 is a sectional view showing exemplary application of an adsorbent unit of the invention.

The location at which an adsorbent units having the arrangement depicted in FIG. 2 or 3 is placed within a housing is not critical, and an advantageous location may be selected depending on the particular housing. The unit or units may be placed covering the entire face of at least one interior wall selected from the top wall, bottom wall and side walls of the housing, as shown in FIGS. 4-7; or covering a portion of an interior wall of the housing as shown in FIG. 8. The unit or units may also be placed in one or more corners inside the housing, as shown in FIG. 9.

Figure 10:
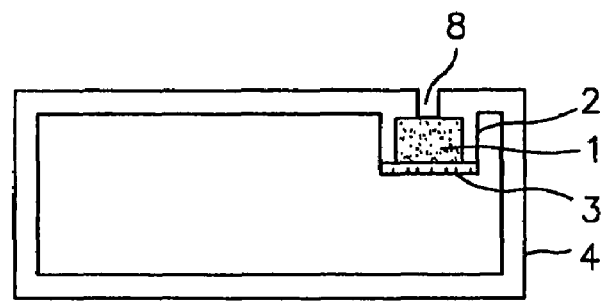
FIG. 10 is a sectional view showing an exemplary adsorbent unit of the invention wherein the container structure is unified with the housing.

Alternatively the containing structure of the adsorbent unit may be unified with the housing. For example, a recess or holder for retaining the adsorbent molded article may be provided in an area of an inside wall of the housing, the adsorbent molded article placed therein, and sealed with breathable material (breathable sheeting) described earlier. An exemplary adsorbent unit of this kind is depicted in FIG. 10.

Where a housing is provided with an air vent communicating between the interior and the outside, as with the housing for a hard disk drive unit, for example, in some instances a filter for trapping contaminants is placed in the air intake to prevent contaminants from being drawn into the enclosure interior from the outside; and the adsorbent unit herein may be endowed with such a filter function as well. Contaminants include dust, water (water vapor), oil, organic gases, inorganic gases and the like; the structure and material of the filter of the adsorbent unit will be selected with reference to the type of contaminant to be prevented from infiltrating into the housing interior.

Figure 11:
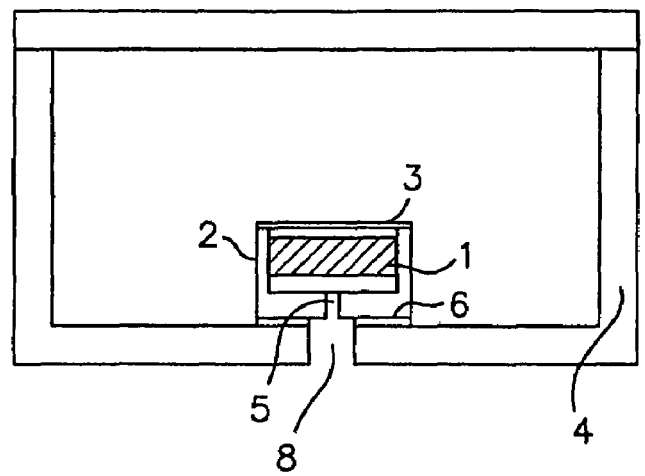
FIG. 11 is a sectional view showing an exemplary adsorbent unit of the invention applied in a housing having an air intake.

FIG. 11 shows an example of an adsorbent unit herein applied to a housing having an air intake in its bottom wall. The adsorbent unit of FIG. 11 is provided with an opening 5 in an area of its containing structure 2, and on the wall opposite the opening 5 (inside wall of housing 4) with a breathable sheet 3 that functions as a filter. Any of the breathable sheet materials mentioned previously for the containing structure may be used as breathable sheet 3.

When installing the adsorbent unit inside the housing, the opening 5 of the adsorbent unit is juxtaposed to the air intake 8 of housing 4 as shown in FIG. 11, affixing the adsorbent unit so as to cover the air intake 8 of housing 4. By placement of the adsorbent unit in this way, contaminants entering the housing interior through the air intake are trapped by the filter of the adsorbent unit. By employing a adsorbent molded article that contains activated carbon or similar material, gas phase contaminants not eliminated by ordinary filters can be adsorbed as well.

Figure 12:
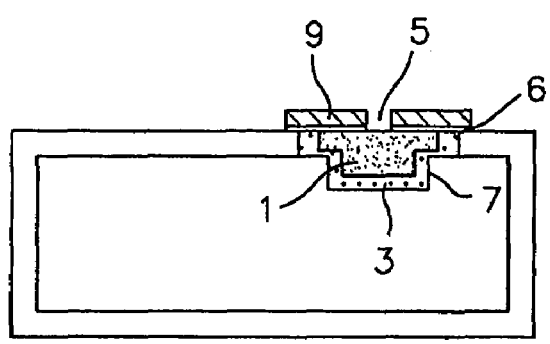
FIG. 12 is a sectional view showing an exemplary adsorbent unit of the invention applied in a housing having an air intake.

Alternatively, an adsorbent unit 7 like that illustrated in FIG. 3 can be installed with the breathable sheet 3 end thereof mating within the air intake of the housing, and with a protective sheet 9 applied over adsorbent unit 7 at the end thereof facing outward from the housing (i.e. over a pressure sensitive adhesive sheet 6) as shown in FIG. 12. The protective sheet is not particularly limited, and may consist inter alia of known art plastic films, metal films, plastic film/metal film laminates, and so on. As shown in FIG. 12, the protective sheet and pressure sensitive adhesive sheet are provided with vent openings.

Applications for the adsorbent molded article and adsorbent unit herein are now described.

Adsorbent Molded Article and Adsorbent Unit Applications

The adsorbent molded article and adsorbent unit herein are used within a housing; the housing is typically a semi-hermetic enclosure. This is because the invention provides particular advantage when applied in semi-hermetic enclosures used as housings for optical and electronic equipment typically require that water and other harmful gases gradually infiltrating from the outside be adsorbed for indefinite periods.

An organic EL element is a typical example of optical equipment for application of the adsorbent molded article and adsorbent unit herein. As noted, to avoid degradation over time, an organic EL element is typically enclosed in a hermetic enclosure, and this hermetic enclosure corresponding to the housing referred to hereinabove. The following description of organic EL elements embodying the adsorbent unit or adsorbent molded article herein refers to the accompanying drawings.

Figure 13:
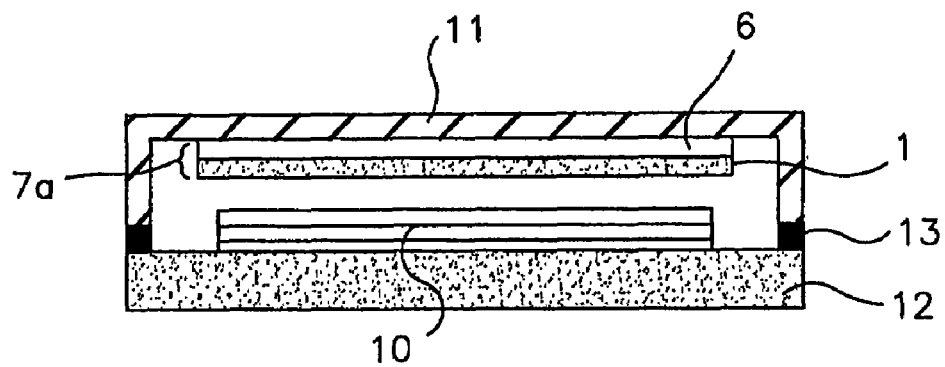
FIG. 13 is a sectional view showing exemplary application of an adsorbent unit of the invention in an organic EL element.

In the organic EL elements depicted in FIGS. 13-21, an organic EL structure 10 is formed on a substrate 12 and sealed with a sealing member 11. In the example of FIG. 13, an adsorbent unit 7a comprising pressure sensitive adhesive 6 laminated to a adsorbent molded article 1 is affixed by means of the pressure sensitive adhesive to the top inside wall of sealing member 11.

Figure 14:
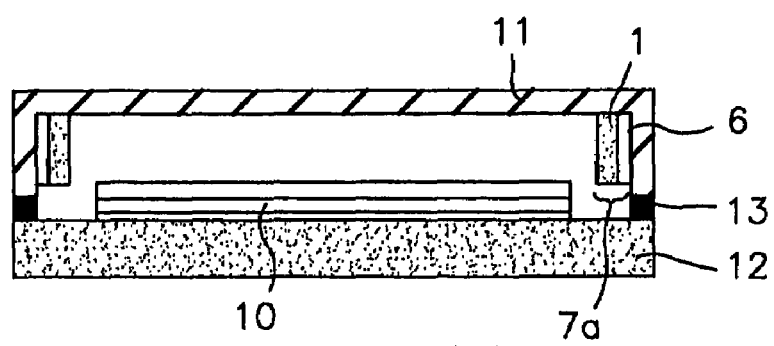
FIG. 14 is a sectional view showing exemplary application of an adsorbent unit of the invention in an organic EL element.

In the example of FIG. 14, adsorbent unit 7a is affixed by means of pressure sensitive adhesive 6 to the two side walls of sealing member 11.

Figure 15:
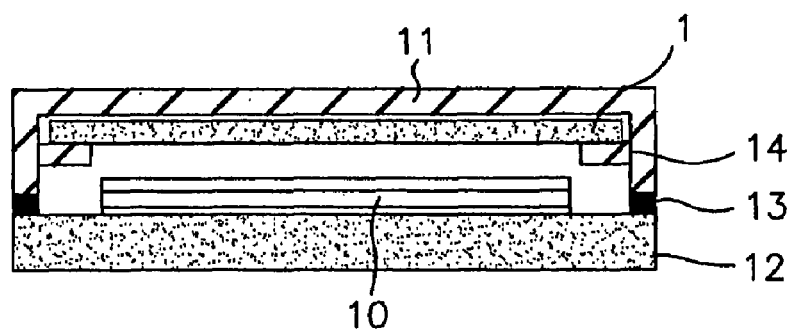
FIG. 15 is a sectional view showing exemplary application of an adsorbent unit of the invention in an organic EL element.

In the example of FIG. 15, adsorbent molded article 1 is encased by projecting portions 14 provided to sealing member 11, affixed to the top inside face of sealing member 11.

Figure 16:
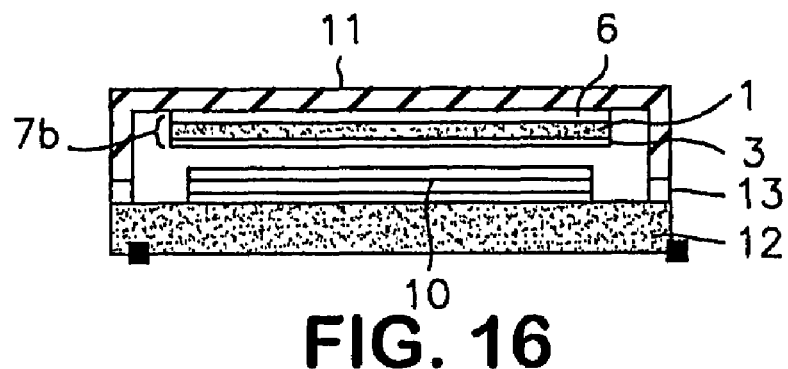
FIG. 16 is a sectional view showing exemplary application of an adsorbent unit of the invention in an organic EL element.

FIG. 16 is an example of an adsorbent unit 7b having a breathable sheet 3 laminated to the face of adsorbent molded article 1 on the opposite side from the face thereof to which pressure sensitive adhesive 6 is laminated. Adsorbent unit 7b is affixed to the upper inside wall of sealing member 11 by means of pressure sensitive adhesive 6.

Figure 17:
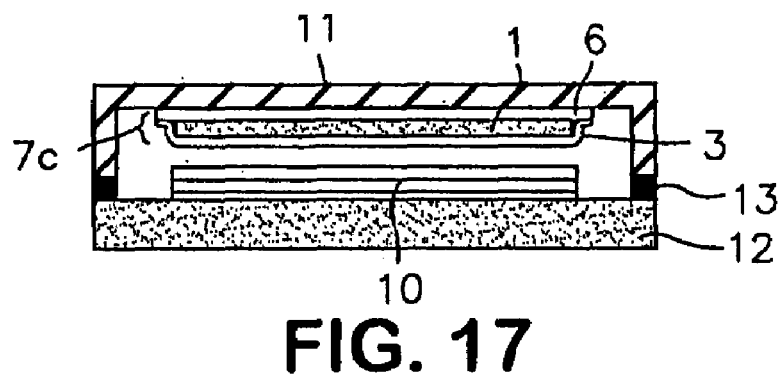
FIG. 17 is a sectional view showing exemplary application of an adsorbent unit of the invention in an organic EL element.

FIG. 17 is an example of an adsorbent unit 7c having a breathable sheet 3 covering all surfaces of adsorbent molded article 1 other than the pressure sensitive adhesive 6 lamination face. Adsorbent unit 7c is affixed to the upper inside wall of sealing member 11 by means of pressure sensitive adhesive 6.

Figure 18:
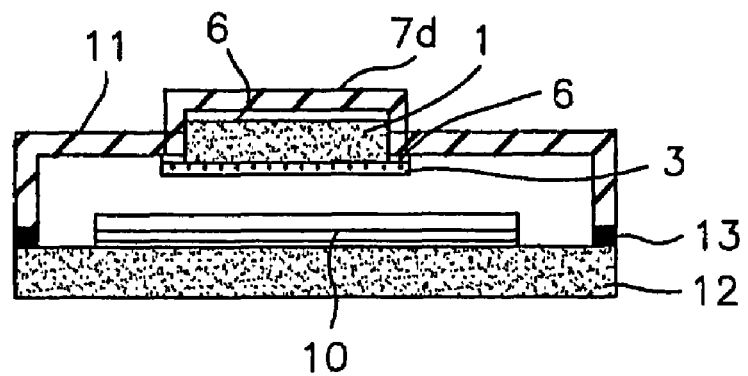
FIG. 18 is a sectional view showing exemplary application of an adsorbent unit of the invention in an organic EL element.

FIG. 18 is an example of an adsorbent unit 7d in which the sealing member and containing structure are unified.

Figure 19:
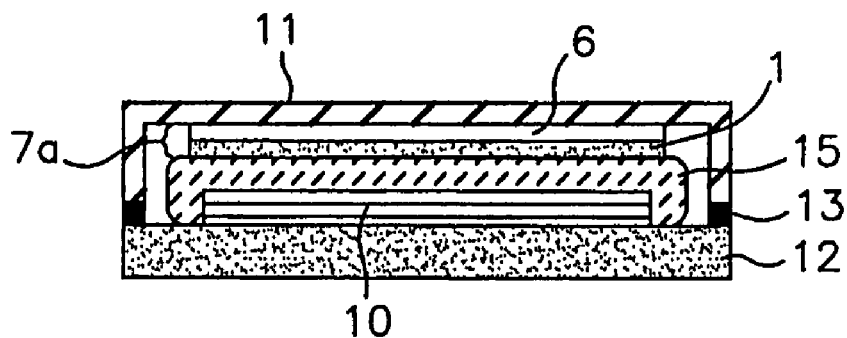
FIG. 19 is a sectional view showing exemplary application of an adsorbent unit of the invention in an organic EL element.

In the example of FIG. 19, an adsorbent unit 7a having a pressure sensitive adhesive 6 laminated to adsorbent molded article 1 is affixed by means of pressure sensitive adhesive 6 to the upper inside wall of sealing member 11; additionally, a cushioning material 15 is interposed between the adsorbent unit 7a and the organic EL structure 10.

Figure 20:
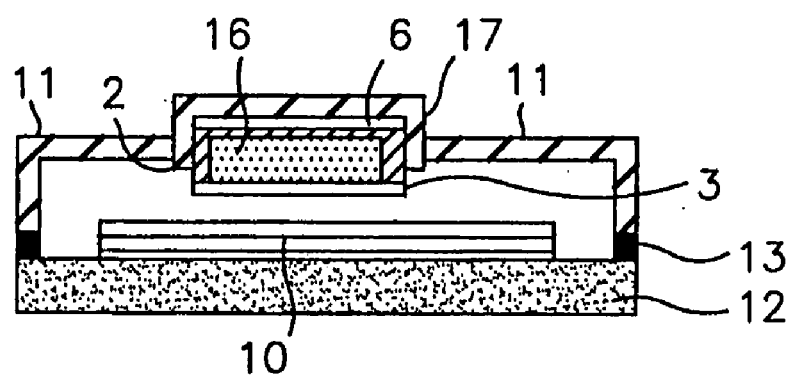
FIG. 20 is a sectional view showing exemplary application of an adsorbent unit of the invention in an organic EL element.

FIG. 20 depicts an example of an adsorbent unit wherein, instead of an adsorbent molded article 1, granular adsorbent 16 of the invention is enclosed in a containing structure 2, a portion of the containing structure 2 being sealed with a breathable sheet 3; the unit is affixed by means of a pressure sensitive adhesive 6 within a recess 17 provided on the top inside wall of sealing member 11.

Figure 21:
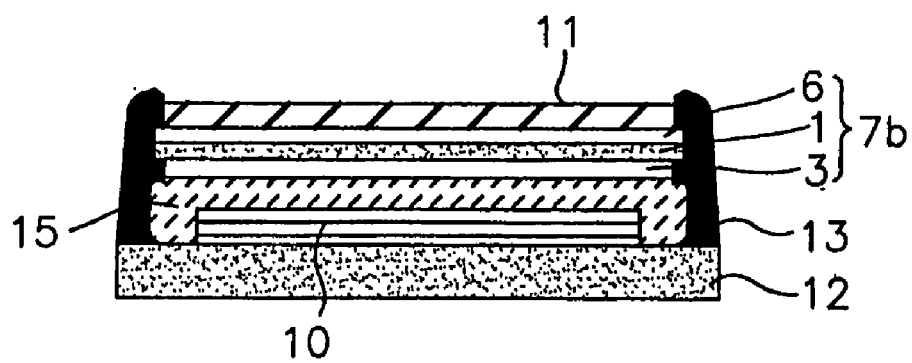
FIG. 21 is a sectional view showing exemplary application of an adsorbent unit of the invention in an organic EL element.
Figure 22:
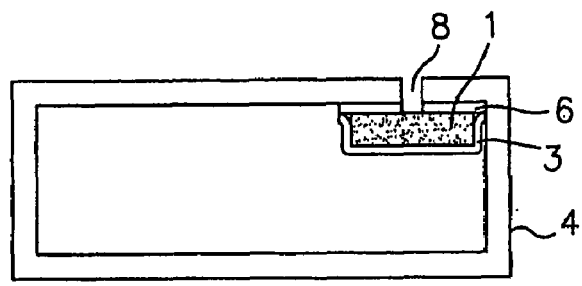
FIG. 22 is a sectional view showing exemplary application of an adsorbent unit of the invention in a hard disk drive unit.

In the example of FIG. 21, an adsorbent unit 7b having a breathable sheet 3 laminated to the face of adsorbent molded article 1 on the opposite side from the face thereof to which pressure sensitive adhesive 6 is laminated is affixed by means of pressure sensitive adhesive 6 to the upper inside wall of sealing member 11; additionally, a cushioning material 15 is interposed between the adsorbent unit, with the cushioning material 15 and adsorbent unit 7b being affixed to a substrate 12 by means of a sealing resin (bonding adhesive) 13.

The organic EL structure 10 (electroluminescent element) is an organic compound that emits light when electrically stimulated, and can be used as a display element. Organic EL structures of various kinds known in the art may be used herein. Such organic EL structures are described inter alia by C. W. Tang and S. A. VanSlyke, Appl. Phys. Lett. 51, 913 (1987). The substrate 12 is not particularly limited and may be selected from the known art.

Sealing member 11 is not particularly limited provided it is of cover configuration (tabular in the example of FIG. 21) that may be attached to the substrate by, for example, sealing resin (bonding adhesive), so as to hermetically seal the organic EL structure. Materials include stainless steel, titanium, aluminum and other metals, glass, quartz, plastic etc.

The material for joining the sealing member and substrate is not critical provided that it fills the gap between the sealing member and substrate so that the interior is hermetically sealed by the sealing member and substrate; however, resin sealants (sealing resins) are preferred. Resin sealants include thermal curing, chemical curing, photocuring and other types of adhesive known in the art, with photocuring adhesives being the most advantageous as heat is not required, thus minimizing effects on the organic EL structure. Any of the photocuring adhesives known in the art are suitable, with cationic curing type UV-curing epoxy adhesives being preferred for their low gas emission.

Cushioning material 15 is provided to prevent external shock applied to the sealing member from being transmitted to the organic EL structure. Cushioning materials may be selected appropriately from those having cushioning qualities. Examples are porous films of fluororesin, polyolefin resin, polyester resin, polyurethane resin etc., and foam materials of polyurethane resin, melamine resin, polyolefin resin etc. Porous PTFE film is particularly suitable for its excellent resistance to heat and chemicals, absence of dusting, and ease of thinning.

Cushioning material thickness is typically 10 μm-2 mm (preferably 30 μm-1 mm). Where the cushioning material is porous PTFE film, maximum pore size and porosity are recommended to be about the same as in the porous PTFE film used for the breathable sheet described earlier. Material thickness is 10 μm-1 mm, preferably 30-300 μm. With porous PTFE film of thickness below this range it may not be possible to ensure adequate cushioning. Where film thickness exceeds this range, material costs will be higher and permeability to moisture and other gases may decline, impairing the adsorbent performance of the adsorbent molded article.

In another preferred embodiment the cushioning material 15 functions also as the breathable sheet. In this case the breathable sheet will consist of material having both air permeability and cushioning properties, such as porous PTFE film.

The cushioning material and sealing member for the organic EL element shown in FIG. 21 may be pre-laminated to the adsorbent unit (adsorbent molded article). Lamination may be accomplished by methods such as adhesive or thermal bonding to one face of the adsorbent molded article to join the cushioning material or sealing member. Where adhesive lamination is used, the materials may be joined after transferring areas of adhesive to the lamination face of the adsorbent molded article or cushioning material (sealing member) by means of a gravure roll etc. Transferred adhesive coverage is typically 3-95%, preferably 10-80%. Adhesive coverage below this range may not give adequate adhesive strength, while above this range the adsorbing ability of the adsorbent molded article may suffer.

Where thermal bonding lamination is employed, the juxtaposed adsorbent molded article and cushioning material are passed through heat rolls to subject them to heat and pressure, causing the adsorbent molded article binder resin and/or the lamination face of the cushioning material (sealing member) to partially melt and fuse together. Thermal bonding may also be accomplished by the above method, but interposing between the adsorbent molded article and cushioning material a sheet (or net) of a hot melt adhesive known in the art. The area of thermal bonding is 3-95%, preferably 10-80%.

Since organic EL structures are typically extremely thin (1 μm or less in thickness), when cushioning material is pressed against an organic EL structure, the cushioning material envelops the organic EL structure (FIG. 19, FIG. 21).

The adsorbent molded article and adsorbent unit herein are advantageous not only in optical equipment such as the organic EL element described hereinabove, but also in electrical equipment employing semi-hermetic enclosure housings. A hard disk drive unit is a typical example of such electrical equipment.

Typically the housing of a hard disk drive unit consists of an aluminum die-cast case and a stainless steel cover, screwed together with a gasket between them; the housing is typically provided with an air intake for regulating pressure, i.e. a semi-hermetic enclosure. In preferred practice the adsorbent molded article or adsorbent unit herein will be arranged in the air intake portion, so as to remove contaminants entering though the air intake from the outside.

Where the adsorbent unit herein is installed in the housing of a hard disk drive unit, the adsorbent unit composed of an adsorbent molded article housed in a containing structure may be mated with the air intake (FIG. 1) or affixed by means of pressure sensitive adhesive, with an opening provided to the adsorbent unit juxtaposed to the air intake of the housing (FIG. 11). Alternatively, the adsorbent unit may be mated with the air intake of the housing, attaching breathable sheeting to the adsorbent unit on the surface thereof exposed within the housing, as shown in FIG. 12.

Alternatively the adsorbent unit may be arranged on the inside wall of housing 4, affixed covering air intake 8 by means of pressure sensitive adhesive 6, with surfaces thereof other than the affixed face being covered by breathable material (breathable sheet 3), as shown in FIG. 21. In yet another alternative embodiment, shown in FIG. 10, a containing portion (containing structure 2) is provided covering air intake 8, with a adsorbent molded article 1 being enclosed within containing portion (containing structure 2) and sealed by a breathable sheet 3 on the side thereof situated inside the housing.

EXAMPLES

A fuller understanding of the invention is provided through the following examples; the examples are merely illustrative and not limiting of the invention, with various modifications and improvements being apparent to the skilled practitioner without diverging from the scope and spirit of the invention as set forth hereinabove and hereinbelow.

Without intending to limit the scope of the present invention, the following examples illustrate how the present invention may be made and used:

Example 1

Under an inert gas (nitrogen) atmosphere, methyl oleate (absorption-regulating substance, UNISTAR M-182A from NOF Corp.) was added in an amount of 5 wt % to powdered strontium oxide (granular adsorbent, 325-15 ex Nacalai Tesque) and mixed evenly. Under nitrogen the resultant mixture was combined with activated carbon (processing aid A-BAC PW from Kureha Chemical Industry, 15 μm mean particle size) and PTFE fine powder (6J from Mitsui DuPont Fluorochemical, 200 μm mean particle size). Mixture ratios, on a weight basis, were 1 part activated carbon and 1 part PTFE fine powder to 8 parts granular adsorbent/absorption-regulating substance mixture. The resultant mixture was compounded with 18 wt % cyclic organopolysiloxane (molding aid, KF994 ex Shin-Etsu Chemical). The compound was subjected to preforming (pressure: 0.3 MPa, time: 1 min., temp. 25° C.) and then to ram extrusion (pressure: 10 MPa, extrusion speed 550 mm/min., temp. 50° C.) to produce a 2 mm thick sheet profile. This was dried at 220° C. for 2 hours, calendered with a calender roll to give a sheet of approximately 0.2 mm thickness (adsorbent molded article No. 1).

Adsorbent molded article No. 1, having been dried at 150° C. for 20 minutes, was placed under nitrogen and double-sided pressure sensitive adhesive tape (from Nitto Denko, 50 μm thick polyester based coated on both sides with 30 μm layers of acrylic pressure sensitive adhesive #5911, total thickness 110 μm) applied to one face thereof, to produce adsorbent unit No. 1. Under the same atmosphere, 25 mm φ circles were punched from the material. Percentage moisture removal was measured by the method described hereinbelow.

Adsorbent unit No. 1 was placed in a cell of 14.3 cm³ (φ 27 mm×25 mm) capacity equipped with a gas intake (φ ⅛ inch) and gas outlet (φ ⅛ inch). The adsorbent unit was secured by means of the double-sided pressure sensitive adhesive tape to an adjustable-height stainless steel stage (φ 26 mm×12 mm) with the top face of the adsorbent unit aligned with the center height of the gas intake. Hydrated gas having a dew point of −15° C. was flowed into the cell through the gas intake at 50 cm³/min, measuring the dew point of the gas exiting from the gas outlet every minute, and calculating the amount of adsorbed moisture at each measurement point. Percentage moisture removal was calculated from adsorbed moisture and the moisture content of the −15° C. dew point hydrated gas (1.387 mg/L). A General Eastern Dew Point Generator DPG-300 was used to generate dew point. Dew point was measured with a General Eastern Hygro[meter] M4 (with the 1311DR-SR sensor) dew point meter. Piping in the dew point gas generator and the cell, and the cell and dew point meter, was stainless steel pipe (φ ⅛ inch EP pipe) to prevent infiltration of moisture from the outside. Results are given in FIG. 23. From the graph in FIG. 23 it was calculated that it took 27 hours for percentage moisture removal by adsorbent unit No. 1 to reach ≦30%.

Under nitrogen, adsorbent unit No. 1 was punched to dimensions of 9×17 mm and assembled in an organic EL element. The organic EL element was fabricated as follows. ITO electrodes from Tokyo Sanyo Shimkus (glass, 15×30× 1.1 mm, ITO (In—Sn compound oxide): 2 mm width×1500 Å×2) were ultrasonically cleaned for 5 minutes in purified water, acetone, then 2-propanol, and when dry subjected to ultraviolet ozone cleaning for 2 minutes. The unit was placed in a vacuum chamber, the chamber brought to a ≦3.0×10⁻⁴ Pa vacuum, and α-NPD (an aromatic amine) (from Nippon Steel Chemical) was deposited thereon to a depth of 500 Å at a rate of 2.0 Å to produce a positive hole migration layer. Next, an Alq3 (tris(8-quinolinolato)aluminum complex from Nippon Steel Chemical) photoemitting layer was deposited to a depth of 500 Å at a rate of 2.0 Å. LiF (from Kojundo Kagaku) was then deposited on the ITO electrodes to a depth of 6 Å at a rate of 0.3 Å, using a vertical mask 2 mm wide, followed by deposition of Al to a depth of 2000 Å. The resultant organic EL structure was then removed from the vacuum chamber.

The organic EL structure was placed in a glove box under nitrogen (dew point ≦−80° C.) and sealed with a sealing member. Sealing member dimensions were 15×30×1.1 mm; the material had a recess in its center for accommodating a 10×25×0.5 mm adsorbent unit. The punched adsorbent unit No. 1 was affixed to the recess of the sealing member, and the sealing member and ITO glass substrate of the organic EL structure were bonded together with thermal curing epoxy resin (from Asahi Denka Kogyo). Silver paste and copper foil were used for electrical connection to the positive (ITO) and negative (Al) electrodes of the organic EL structure.

The resultant organic EL structure No. 1 was kept for 300 hours in a constant temperature and humidity chamber maintained at 60° C. internal temperature and 90% relative humidity. Voltage of DC 6 V was then applied to organic EL structure No. 1 while observing for any decrease in light emitting area to evaluate degradation over time. Organic EL structure No. 1 experienced substantially no decrease in light emitting area, demonstrating negligible degradation over time.

Example 2

Adsorbent unit No. 2 was prepared in the same manner as in Example 1, except for combining the calcium hydroxide powder (038-16295 from Wako Pure Chemical) heat treated under nitrogen (580° C., 5 hr) (in other words, calcium oxide powder) with the same powdered strontium oxide used in Example 1, in a 4:6 weight ratio under nitrogen; and changing the amount of the same methyl oleate used in Example 1 to 7 wt %.

The resultant adsorbent unit No. 2 was tested for percentage moisture removal in the same manner as in Example 1. Results are given in FIG. 23. From the graph in FIG. 23 it was calculated that it took 19 hours for percentage moisture removal by adsorbent unit No. 2 to reach ≦30%.

Using adsorbent unit No. 2, an organic EL element No. 2 was fabricated in the same manner as in Example 1, and evaluated for degradation over time in the same manner as in Example 1. Organic EL structure No. 2 experienced substantially no decrease in light emitting area, demonstrating negligible degradation over time.

Example 3

Under nitrogen, methyl oleate (absorption-regulating substance, UNISTAR M-182A from NOF Corp.) was added in an amount of 5 wt % to powdered strontium oxide (granular adsorbent, 325-15 ex Nacalai Tesque) and mixed evenly. Under nitrogen the resultant mixture was combined with activated carbon (processing aid A-BAC PW from Kureha Chemical Industry, 15 μm mean particle size) and PTFE fine powder (6J from Mitsui DuPont Fluorochemical, 200 μm mean particle size). Mixture ratios, on a weight basis, were 5 parts activated carbon and 10 parts PTFE fine powder to 85 parts granular adsorbent/absorption-regulating substance mixture. The resultant mixture was calendered to give a sheet of approximately 0.2 mm thickness (adsorbent molded article No. 3).

Using the resultant adsorbent molded article No. 3, adsorbent unit No. 3 was produced in the same manner as in Example 1.

Using adsorbent unit No. 3, an organic EL element No. 3 was fabricated in the same manner as in Example 1, and evaluated for degradation over time in the same manner as in Example 1. Organic EL structure No. 3 experienced substantially no decrease in light emitting area, demonstrating negligible degradation over time.

Comparison 1

An organic EL structure No. 4 was fabricated in the same manner as in Example 1, except without using an adsorbent unit, and evaluated for degradation over time in the same manner as in Example 1. Organic EL structure No. 4 experienced an appreciable decrease in light emitting area, demonstrating degradation over time.

Comparison 2

An adsorbent unit No. 5 was fabricated in the same manner as in Example 1, except without using methyl oleate (absorption-regulating substance).

The resultant adsorbent unit No. 5 was measured for percentage moisture removal in the same manner as in Example 1. Results are given in FIG. 23. From the graph in FIG. 23 it was calculated that it took 7.5 hours for percentage moisture removal by adsorbent unit No. 5 to reach ≦30%.

Using adsorbent unit No. 5, an organic EL structure No. 5 was fabricated in the same manner as in Example 1 and evaluated for degradation over time in the same manner as in Example 1. Organic EL structure No. 5 showed a decrease in light emitting area, demonstrating degradation over time.

The invention, by virtue of the constitution described hereinabove, now provides a adsorbent molded article and adsorbent unit whose adsorbing ability is sustained for an indefinite period. This feature of the adsorbent molded article and adsorbent unit make them useful in applications requiring that moisture etc. be adsorbed for an extended period, such as in optical or electronic equipment with semi-hermetic housings, like organic EL elements or hard disk drive units.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. Adsorbent molded article for use within a housing, said adsorbent molded article comprising as constituent materials thereof:
   granular adsorbent coated at least partially with an absorption-regulating substance comprising a fatty acid and/or derivative thereof; and
   binder;
   wherein an adsorbent molded article having volume of about 98 mm$^3$, when placed in a cell of about 14.3 cm$^3$ capacity having an air intake and an air outlet, supplied via said air intake with a continuous 50 cm$^3$/min flow of hydrated gas having a dew point of about −15° C., and measured for the percentage of moisture removed from hydrated gas exiting via said air outlet, takes about 10 hours or more for said percentage of moisture removed to reach about 30% or less.

2. Adsorbent molded article according to claim 1 wherein said granular adsorbent are coated completely with an absorption-regulating substance.

3. Adsorbent molded article for use within a housing, comprising as constituent materials thereof:
   granular adsorbent coated at least partially with an absorption-regulating substance comprising fatty acid and/or derivative thereof; and
   binder resin.

4. Porous adsorbent molded article according to claim 1.
5. Porous adsorbent molded article according to claim 2.
6. Porous adsorbent molded article according to claim 3.
7. Adsorbent molded article according to claim 1 wherein said granular adsorbent is a moisture adsorbent.
8. Adsorbent molded article according to claim 2 wherein said granular adsorbent is a moisture adsorbent.
9. Adsorbent molded article according to claim 3 wherein said granular adsorbent is a moisture adsorbent.
10. Adsorbent molded article according to claim 4 wherein said granular adsorbent is a moisture adsorbent.
11. Adsorbent molded article according to claim 6 wherein said granular adsorbent is a moisture adsorbent.
12. Adsorbent molded article according to claim 1 wherein said adsorbent is an alkaline earth metal oxide.
13. Adsorbent molded article according to claim 3 wherein said adsorbent is an alkaline earth metal oxide.
14. Adsorbent molded article for use within a housing according to claim 3 wherein said granular adsorbent is coated completely with said absorption-regulating substance.
15. Adsorbent molded article according to claim 1 wherein said binder is fluororesin and/or polyolefin resin.
16. Adsorbent molded article according to claim 3 wherein said binder is fluororesin and/or polyolefin resin.
17. Adsorbent molded article according claim 1 wherein said binder is polytetrafluoroethylene.
18. Adsorbent molded article according claim 3 wherein said binder is polytetrafluoroethylene.
19. Adsorbent molded article according to claim 1 having spectral reflectance factor in accordance with JIS Z 8722 Method b is of 0.7.
20. Adsorbent molded article according to claim 3 having spectral reflectance factor in accordance with JIS Z 8722 Method b is of 0.7.
21. Adsorbent unit for use within a housing wherein said adsorbent unit comprises adsorbent molded article according to claim 1.
22. Adsorbent unit for use within a housing wherein said adsorbent unit comprises adsorbent molded article according to claim 3.
23. Adsorbent unit according to claim 21 wherein said adsorbent molded article is provided at least in part with a pressure sensitive adhesive portion or bonding adhesive portion.
24. Adsorbent unit according to claim 22 wherein said adsorbent molded article is provided at least in part with a pressure sensitive adhesive portion or bonding adhesive portion.
25. Adsorbent unit according to claim 21 wherein said adsorbent molded article is contained within a containing structure composed at least in part of breathable sheet material.
26. Adsorbent unit according to claim 22 wherein said adsorbent molded article is contained within a containing structure composed at least in part of breathable sheet material.
27. Adsorbent unit according to claim 25 wherein said breathable sheet material is porous polytetrafluoroethylene film.
28. Adsorbent unit according to claim 26 wherein said breathable sheet material is porous polytetrafluoroethylene film.
29. Adsorbent unit according to claim 25 wherein said containing structure is unified with the housing.
30. Adsorbent unit according to claim 26 wherein said containing structure is unified with the housing.
31. Housing having in the interior thereof adsorbent molded article according to claim 1.
32. Housing having in the interior thereof adsorbent molded article according to claim 3.
33. Housing having in the interior thereof adsorbent unit according to claim 21.
34. Housing having in the interior thereof adsorbent unit according to claim 22.
35. Housing according to claim 31 which is a semi-hermetic enclosure.
36. Housing according to claim 32 which is a semi-hermetic enclosure.
37. Organic electroluminescent element comprising housing according to claim 31.
38. Organic electroluminescent element comprising housing according to claim 32.
39. Hard disk drive unit comprising housing according to claim 31.
40. Hard disk drive unit comprising housing according to claim 32.

* * * * *

UNITED STATES PATENT AND TRADEMARK OFFICE
CERTIFICATE OF CORRECTION

| | | |
|---|---|---|
| PATENT NO. | : 7,300,500 B2 | Page 1 of 1 |
| APPLICATION NO. | : 10/962214 | |
| DATED | : November 27, 2007 | |
| INVENTOR(S) | : Okada et al. | |

It is certified that error appears in the above-identified patent and that said Letters Patent is hereby corrected as shown below:

In column 4, line 56, change "of" to --or--.

In column 6, line 22, change "is" to --its--.

In column 9, line 8, change "a" to --an--.

In column 9, line 11, change "power" to --powder--.

In column 9, line 20, after the word "may" add --be--.

In column 13, line 18, change the word "a" to --an--.

In column 16, line 18, change the word "a" to --an--.

In column 20, line 3, after the word "according" add --to--.

In column 20, line 5, after the word "according" add --to--.

Signed and Sealed this

Eleventh Day of November, 2008

JON W. DUDAS
*Director of the United States Patent and Trademark Office*